United States Patent
Zou et al.

(10) Patent No.: US 11,657,018 B2
(45) Date of Patent: May 23, 2023

(54) SYSTEM AND METHOD FOR DATA-LAYOUT AWARE DECOMPRESSION AND VERIFICATION USING A HARDWARE ACCELERATOR CHAIN

(71) Applicant: EMC IP Holding Company LLC, Hopkinton, MA (US)

(72) Inventors: Colin Zou, San Jose, CA (US); Tao Chen, Beijing (CN)

(73) Assignee: EMC IP HOLDING COMPANY LLC, Hopkinton, MA (US)

(*) Notice: Subject to any disclaimer, the term of this patent is extended or adjusted under 35 U.S.C. 154(b) by 208 days.

(21) Appl. No.: 17/215,122

(22) Filed: Mar. 29, 2021

(65) Prior Publication Data
US 2022/0309030 A1    Sep. 29, 2022

(51) Int. Cl.
*G06F 9/50* (2006.01)
*G06F 9/54* (2006.01)
(Continued)

(52) U.S. Cl.
CPC ...... *G06F 15/8092* (2013.01); *G06F 9/44589* (2013.01); *G06F 9/5044* (2013.01); *G06F 9/545* (2013.01); *G06F 9/546* (2013.01)

(58) Field of Classification Search
CPC ...... G06F 9/545; G06F 9/546; G06F 15/8092; G06F 9/44589; G06F 9/5044; H03M 7/3091
See application file for complete search history.

(56) References Cited

U.S. PATENT DOCUMENTS 9,436,723 B2 * 9/2016 Lumb ............... G06F 3/0683
2016/0070492 A1 * 3/2016 Cherubini ......... G06F 3/0685
                                                       711/114
(Continued)

OTHER PUBLICATIONS

Jian Li; Xiaokang Hu; Qian, David; Changzheng Wei; McFadden, Gordon; Brian Will, Ping Yu, Weigang Li, and Haibing Guan. "QWEB: High-Performance Event-Driven Web Architecture With QAT Acceleration" IEEE (Year: 2020).*

(Continued)

*Primary Examiner* — Jacob Petranek
(74) *Attorney, Agent, or Firm* — Womble Bond Dickinson (US) LLP

(57) ABSTRACT

A computer implemented method of data decompression and verification includes decompressing a compressed data segment to generate a decompressed data region. The method also includes generating a segment vector array (SVA) including a number of segment vectors corresponding to data segments within the decompressed data region, each segment vector indicating a location and a size of a corresponding data segment. The method also includes transmitting the SVA to a chain plugin module and transmitting segment vector array data to a SVA-based message constructor. The method also includes constructing a SVA-based message including the location and size of data segments within the decompressed data region, and transmitting the SVA-based message to a hardware accelerator. The method also includes performing verification sessions at the hardware accelerator, each verification session corresponding to a specific data segment indicated by the SVA-based message.

20 Claims, 7 Drawing Sheets

| SV0 | SV3 | SV2 | | SV1 |
|---|---|---|---|---|
| 501 | 503 | 505 | | 507 |

| SV0 | Offset 0 | Size 0 |
|---|---|---|
| SV1 | Offset 1 | Size 1 |
| SV2 | Offset 2 | Size 2 |
| SV3 | Offset 3 | Size 3 |

(51) Int. Cl.
*G06F 15/80* (2006.01)
*G06F 9/445* (2018.01)

(56) References Cited

U.S. PATENT DOCUMENTS

| | | | |
|---|---|---|---|
| 2020/0341892 A1* | 10/2020 | Duggal | G06F 3/0652 |
| 2021/0014050 A1* | 1/2021 | Liu | G06F 9/3877 |
| 2021/0111735 A1* | 4/2021 | Ugale | H03M 7/3091 |
| 2022/0308925 A1* | 9/2022 | Shilane | G06F 16/134 |

OTHER PUBLICATIONS

Chun-Hua Xiao, Lin-Feng Cheng, Yu-Hua Xie, and Lei Zhang. "User Space or Kernel Space: Performance Evaluation of QAT Accelerator" 4th Annual International Conference on Network and Information Systems for Computers (Year: 2018).*

* cited by examiner

SYSTEM AND METHOD FOR DATA-LAYOUT AWARE DECOMPRESSION AND VERIFICATION USING A HARDWARE ACCELERATOR CHAIN

FIELD OF THE INVENTION

Embodiments of the present invention relate generally to data decompression and verification. More particularly, embodiments of the invention relate to using a hardware accelerator chain to perform data-layout aware decompression and verification.

BACKGROUND

Notable portions of central processing unit (CPU) bandwidth are consumed by compression and decompression in storage systems. In many usage scenarios, such as backup, restore, replication, and verification, system performance is bottlenecked by CPU bandwidth. In some scenarios, performance can be improved using a hardware accelerator.

BRIEF DESCRIPTION OF THE DRAWINGS

Embodiments of the invention are illustrated by way of example and not limitation in the figures of the accompanying drawings in which like references indicate similar elements.

DETAILED DESCRIPTION

Embodiments described herein disclose a computer implemented method of data decompression and verification using a hardware accelerator. A number of non-trivial technical challenges arise when incorporating a hardware accelerator, such as a QuickAssist Technology (QAT) hardware accelerator with a CPU. QAT is an efficient hardware-assisted technology used to enhance security and compression performance. It has been widely used in deduplication systems to improve performance and offload CPU costs.

In an effort to minimize QAT offloading overhead, using QAT chain offloading is becoming increasingly favorable in general storage systems. However, using QAT chain offloading may be challenging in deduplicated systems, where data may be processed on a segment basis. Therefore, it is difficult to exploit conventional QAT chain offloading techniques in deduplicated systems. According to one embodiment, a novel hardware accelerator chain offloading method is disclosed that is aware of the data layout or data segments, thus allowing its use in deduplicated systems.

Various embodiments and aspects of the inventions will be described with reference to details discussed below, and the accompanying drawings will illustrate the various embodiments. The following description and drawings are illustrative of the invention and are not to be construed as limiting the invention. Numerous specific details are described to provide a thorough understanding of various embodiments of the present invention. However, in certain instances, well-known or conventional details are not described in order to provide a concise discussion of embodiments of the present inventions.

Reference in the specification to "one embodiment" or "an embodiment" means that a particular feature, structure, or characteristic described in conjunction with the embodiment can be included in at least one embodiment of the invention. The appearances of the phrase "in one embodiment" in various places in the specification do not necessarily all refer to the same embodiment.

In the description of the embodiments provided herein, the terms "coupled" and "connected," along with their derivatives, may be used. It should be understood that these terms are not intended as synonyms for each other. "Coupled" is used to indicate that two or more elements, which may or may not be in direct physical or electrical contact with each other, co-operate or interact with each other. "Connected" is used to indicate the establishment of communication between two or more elements that are coupled with each other. Additionally, the terms "server," "client," and "device" are intended to refer generally to data processing systems rather than specifically to a particular form factor for the server, client, and/or device.

Figure 1:
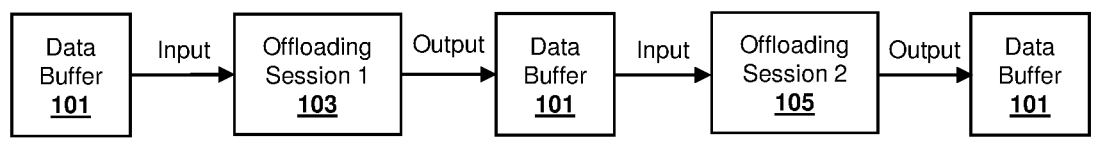
FIG. 1 is a flow diagram illustrating a hardware accelerator offloading chain with two sessions, according to the prior art.

FIG. 1 is a flow diagram illustrating a hardware accelerator offloading chain with two sessions, according to the prior art. According to this conventional hardware accelerator chain, each hardware accelerator session (hereinafter "session") can consume the entire output buffer. This example flow diagram shows a data buffer 101 which passes through a first offloading session 103 and a second offloading session 107. This approach can function properly for storage systems where data segments are placed in separate buffers completely and independently. An example of such a data path is shown in FIG. 2.

Figure 2:
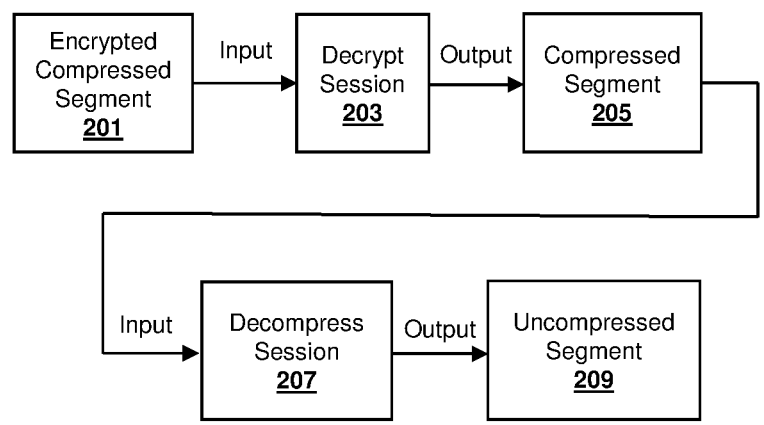
FIG. 2 is a flow diagram illustrating a hardware accelerator offloading chain with decryption and decompression, according to the prior art.

FIG. 2 is a flow diagram illustrating a hardware accelerator offloading chain with decryption and decompression, according to the prior art. In this approach, an encrypted compressed segment 201 is decrypted with a decrypt session 203 to generate a compressed segment 205, which is decompressed at a decompression session 207 to generate an uncompressed segment 209. The decompress session 207 in the chain can consume the entire buffer generated as the output of the decrypt session 207.

However, in a deduplicated system, data segments may be compressed and packed into compression regions, with multiple segments in a bunch. Compression and decompression work on a compression region basis, while other computations, like verification, work on an individual segment basis. This differentiator makes it difficult to use a conventional hardware accelerator chain in some deduplication-specific use cases. For example, in the case where decompression and verification is performed in advanced deduplicated systems that provide high data reliability, to safeguard data integrity compression regions are decompressed and verified to make sure they are correct.

Figure 3:
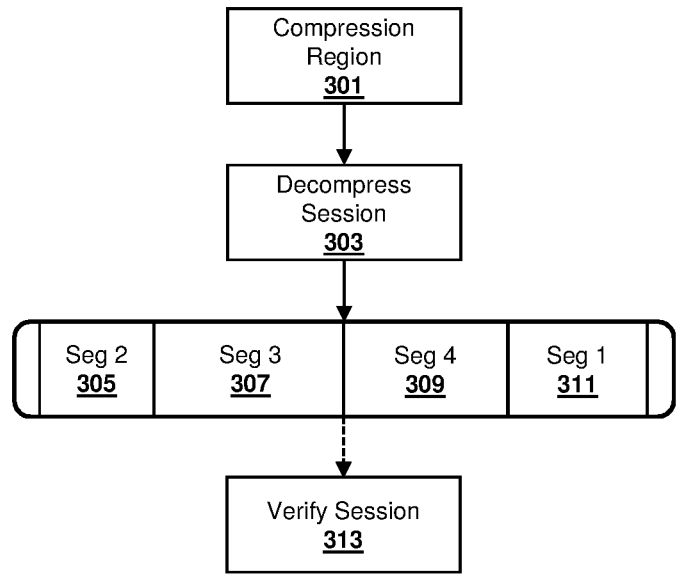
FIG. 3 is a diagram illustrating another hardware accelerator offloading chain, according to an embodiment.

FIG. 3 is a diagram illustrating another hardware accelerator offloading chain, according to an embodiment. According to current hardware accelerator chain techniques, the sessions may proceed as shown in FIG. 3, where the compression region 301 is sent to a decompress session 303 to generate an uncompressed input buffer containing multiple segments 305, 307, 309, 311. In the example shown in FIG. 3, the verify session 313 can mistakenly compute the entire input buffer that contains all the multiple segments, such that the chain does not function.

Figure 4:
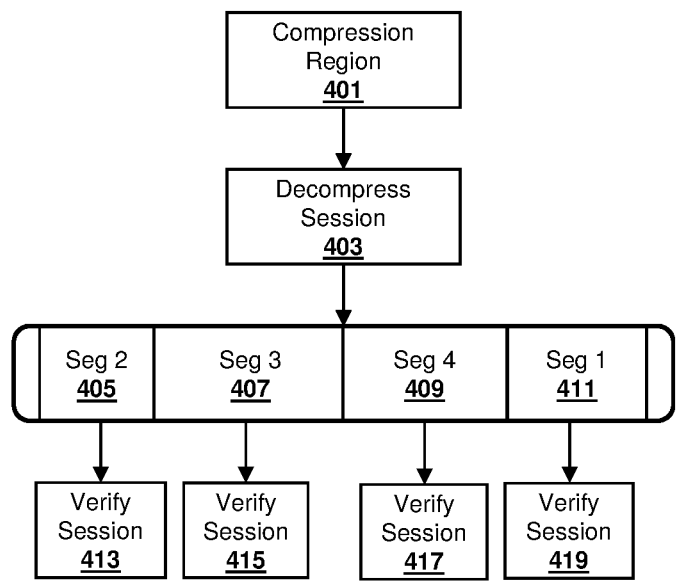
FIG. 4 is a diagram illustrating another hardware accelerator decompression and verification technique, according to an embodiment.

FIG. 4 is a diagram illustrating another hardware accelerator decompression and verification technique, according to an embodiment. Similar to the example shown in FIG. 3, the compression region 401 in FIG. 4 is sent to a decompression session 403 to generate an uncompressed input buffer containing multiple segments 405, 407, 409, 411. However, instead of a single verify session, multiple verify sessions 413, 415, 417, 419 work on individual segments of the input buffer instead of the entire uncompressed region. Although this approach functions, launching multiple separate sessions can lead to tremendous overhead. With so many sessions, the hardware accelerator polling overhead can increase considerably, possibly more than doubling the average latency. Furthermore, more context switches are required between the user space and the kernel space, since each hardware accelerator session requires a round of context switches. Finally, multiple separate sessions can be very detrimental to CPU cache.

Figure 5:
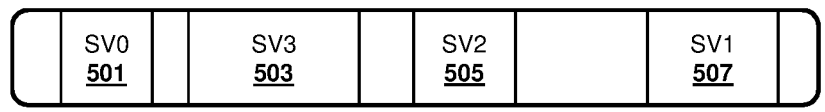
FIG. 5 is a diagram of an example segment vector array (SVA), according to an embodiment of the present disclosure.

FIG. 5 is a diagram of an example segment vector array (SVA), according to an embodiment of the present disclosure. A current dilemma for implementing a hardware accelerator chain is the lack of data layout information in buffer. According to an embodiment of the present disclosure, a SVA is introduced to indicate the data layout to enable a data-layout-aware hardware accelerator chain. In the embodiment shown in FIG. 5, the SVA includes four segment vectors 501, 503, 505, 507, and each segment vector indicates the location (offset) and size of a given data segment within a compression region, like [offset, size]. This informs the hardware accelerator which part of the input buffer needs to be consumed. In this embodiment, the SVA is a set of segment vectors (SV0 501, SV3 503, SV2 505, SV1 507), which can be used by the hardware accelerator chain. As shown in FIG. 5, the segment vectors may be in any order, as long as the offset and size of each data segment is known. The SVA can be generated and passed to the hardware accelerator by the upper layer software that has knowledge of the data segment layout information.

Figure 6:
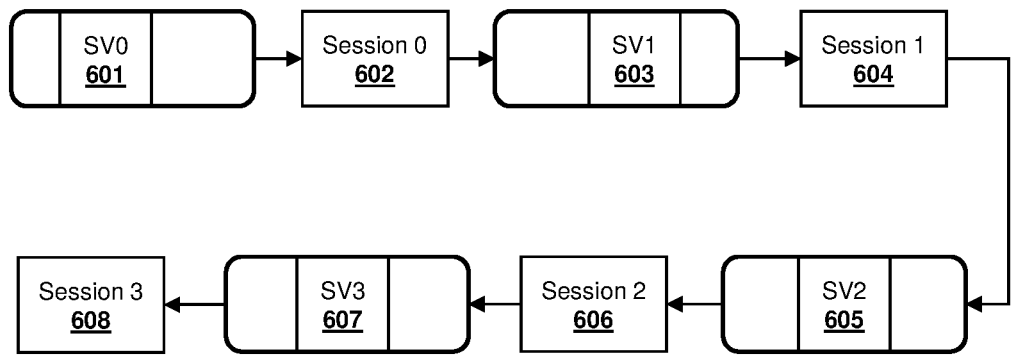
FIG. 6 is a diagram of an example SVA-based hardware accelerator chain, according to an embodiment of the present disclosure.

FIG. 6 is a diagram of an example SVA-based hardware accelerator chain, according to an embodiment of the present disclosure. In this embodiment, instead of blindly consuming the entire input buffer, each session in the SVA-based hardware accelerator offloading chain consumes a specific portion of the input buffer indicated by each segment vector. For example, at Session 0 602, the data segment associated with SV0 601 can be consumed; at Session 1 604, the data segment associated with SV1 603 can be consumed; at Session 2 606, the data segment associated with SV2 605 can be consumed; and at Session 3 608, the data segment associated with SV3 607 can be consumed.

Figure 7:
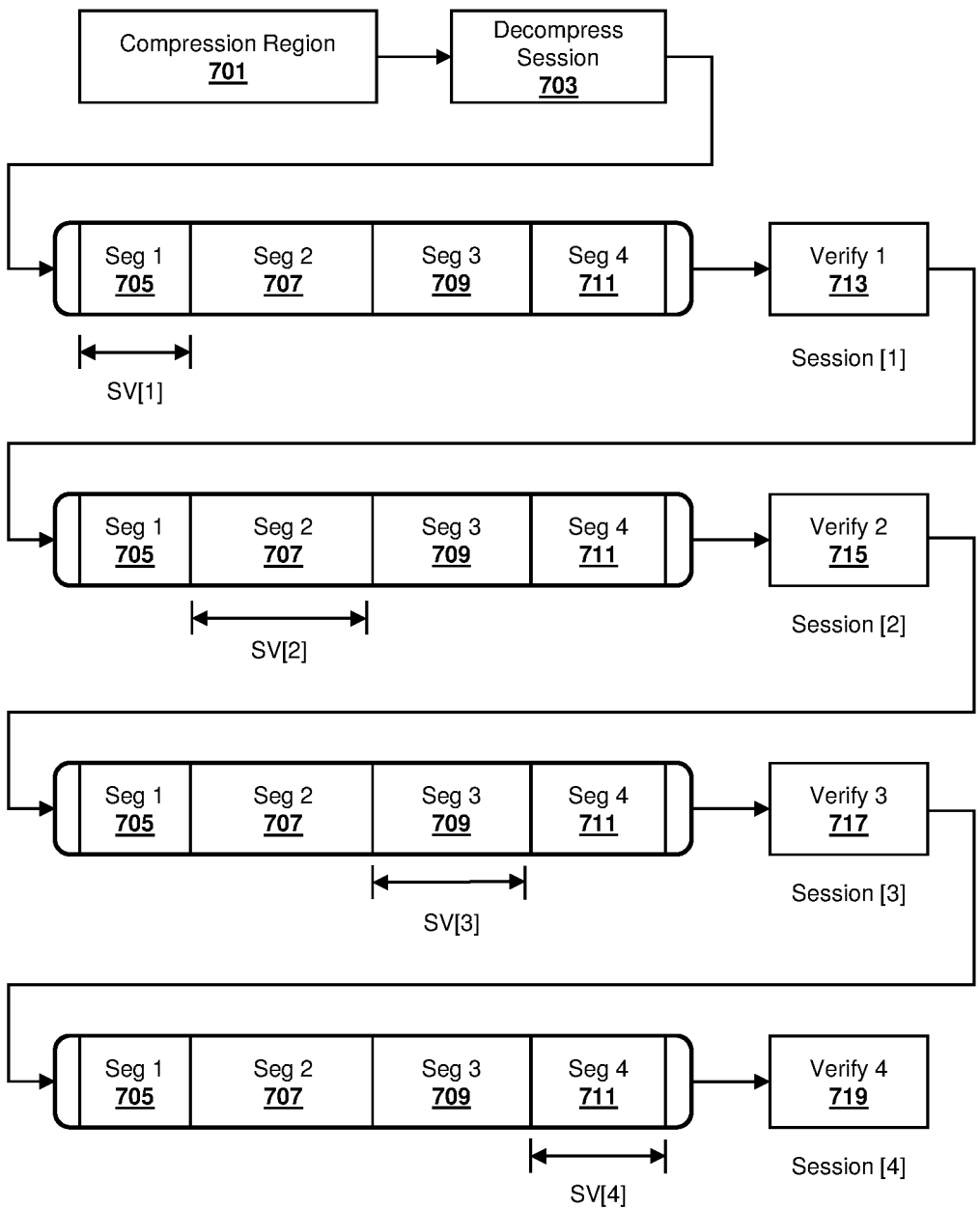
FIG. 7 is a flow diagram of an example decompression and verification chain, according to an embodiment of the present disclosure.

FIG. 7 is a flow diagram of an example decompression and verification chain, according to an embodiment of the present disclosure. In this embodiment, a decompress session 703 can decompress a compression region 701 to generate a decompressed data region having a number of data segments 705, 707, 709, 711. By feeding the SVA to the hardware accelerator, the hardware accelerator can trim input buffers for each session to consume the proper data segment for verification. In this embodiment, a first verification session 713 can verify the first data segment 705 based on the first segment vector, SV[1] Likewise, the second data segment 707 can be verified at the second session 715, the third data segment 709 can be verified at the third session 717, and the fourth data segment 711 can be verified at the fourth session 719. In this embodiment, the decompression session 703 can consume the entire compression region indicated by a segment vector SV[0]. Then, each verification session 713, 715, 717, 719 can consume a specific segment indicated according to the segment vector in a desired order. All sessions are linked as a chain, which is aware of the layout of the data segments (i.e. the offset and size). This chain can also be used in other use cases where data layout is important.

Figure 8:
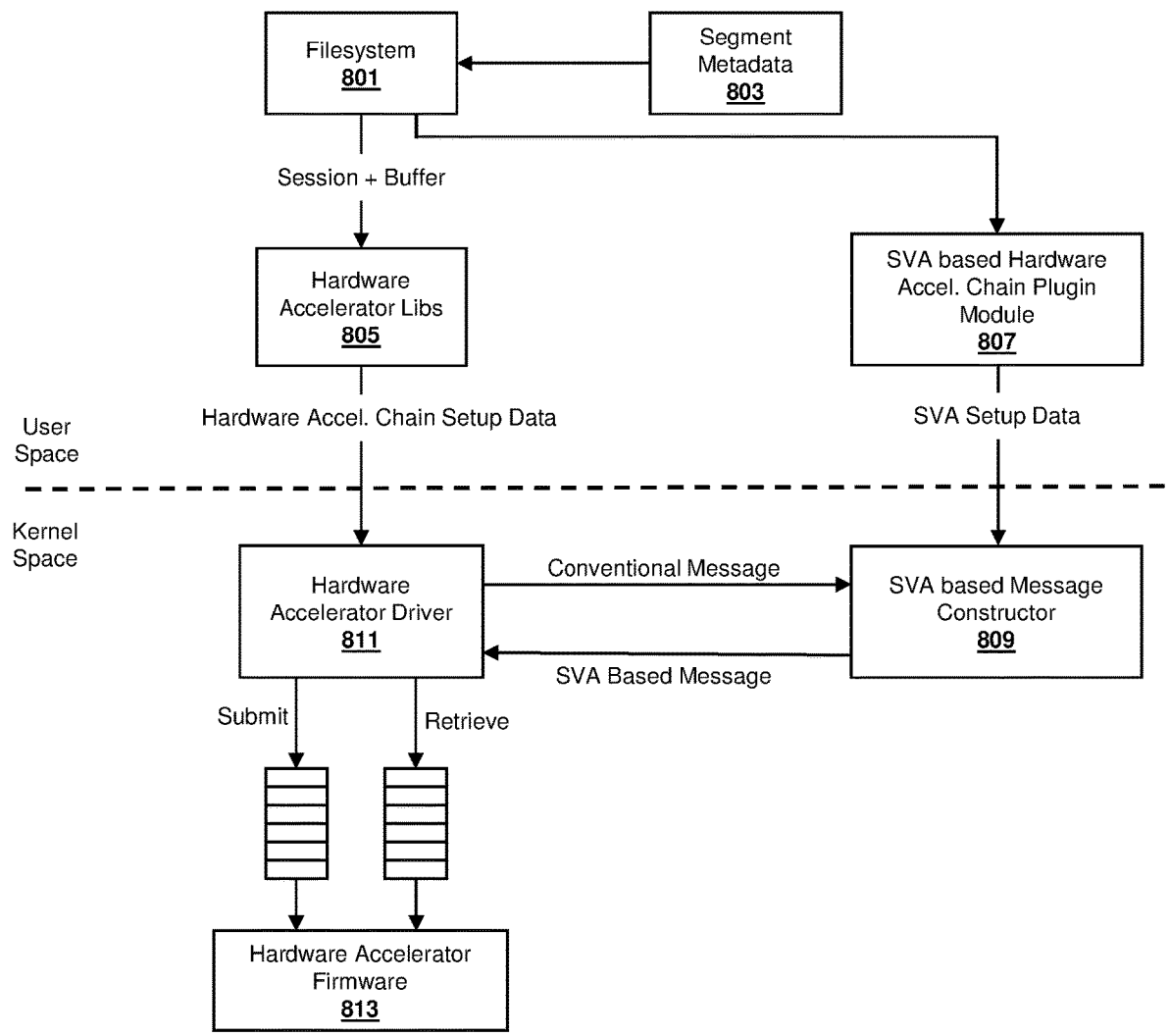
FIG. 8 is a block diagram of an example data compression and verification system, according to an embodiment of the present disclosure.

FIG. 8 is a block diagram of an example data compression and verification system, according to an embodiment of the present disclosure. In this example embodiment, the system includes segment metadata 803, which includes information about the location and size of data segments, and a filesystem 801 responsible for generating a SVA, as discussed herein. The system also includes hardware accelerator libs 805, a hardware accelerator driver 811, hardware accelerator firmware 813, a SVA-based hardware accelerator chain plugin module 807, and a SVA-based message constructor 809. In this embodiment, the SVA-based chain plugin module 807 and the SVA-based message constructor 809 are novel components introduced to support the hardware accelerator chain, where the SVA-based chain plugin module 807 is located at the user space and is used to pass SVA information to the SVA-based message constructor 809, which is located at the kernel space.

In an embodiment, the SVA-based message constructor 809 is used to convert the conventional hardware accelerator messages to SVA-based messages that contain SVA information to indicate the layout of data segments in a data buffer. Eventually, the hardware accelerator firmware 813 can consume the SVA-based messages on a ring buffer to setup hardware accelerator engines. By feeding the SVA information to the hardware accelerator, the hardware accelerator libs 805 can trim input buffers for each session to be consumed accordingly. As the conversion of SVA-based messages happens completely within the kernel space, additional context switch overhead is avoided.

The techniques described herein provide a number of advantages. For example, the SVA-based chain can reduce polling overhead by avoiding multiple separate session launches, and can also reduce context switch overhead by avoiding multiple separate session launches. The SVA-based chain is CPU cache friendly by nature, and can simplify software implementation. In an embodiment, the upper layer software doesn't have to pick up segments from a compression region for the hardware accelerator to offload one at a time. Furthermore, by knowing the layout of the data segments, each segment can be consumed in any desired order.

Figure 9:
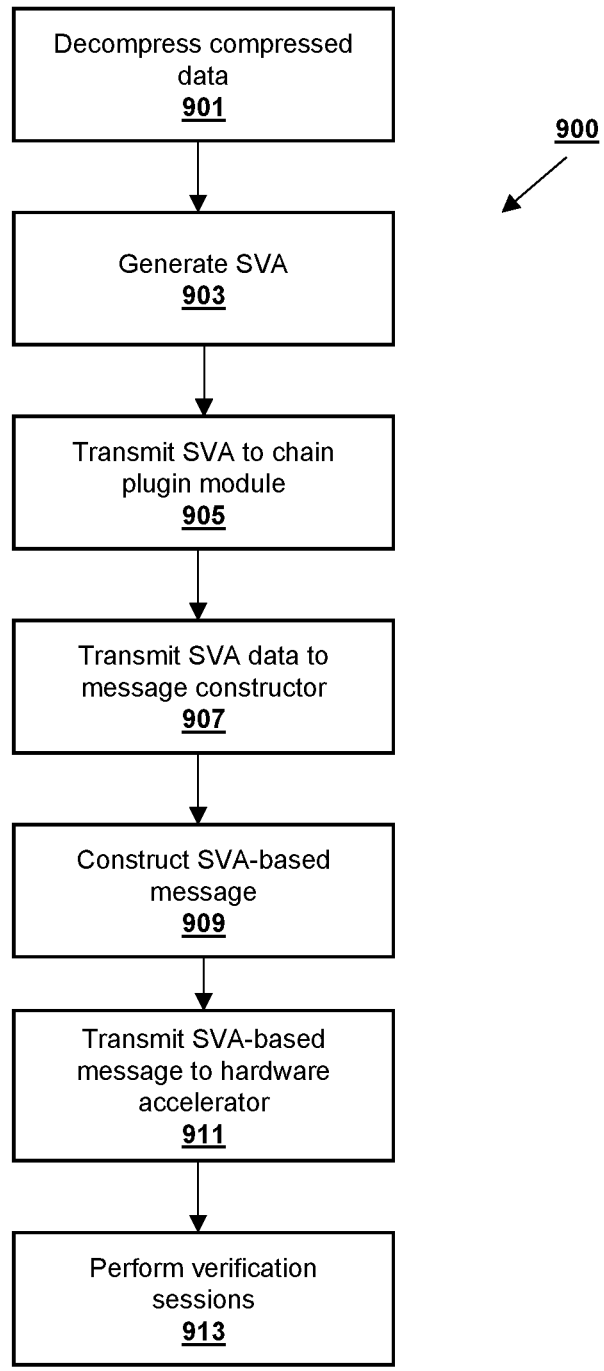
FIG. 9 is a flow diagram of an example data decompression and verification process, according to an embodiment of the present disclosure.

FIG. 9 is a flow diagram of an example data decompression and verification process 900, according to an embodiment of the present disclosure. At operation 901, a compressed data segment is decompressed in a decompression session to generate a decompressed data region. As discussed above, the decompressed data region includes a number of data segments.

At operation 903, a SVA is generated including a number of segment vectors. The segment vectors correspond to the data segments within the decompressed data region generated at operation 901, and each segment vector indicates a location and size of its corresponding data segment.

At operation 905, the SVA is transmitted to a chain plugin module. In an embodiment, the chain plugin module is located within a user space along with the filesystem responsible for generating the segment vector array.

At operation 907, the segment vector array data is transmitted to a SVA-based message constructor from the chain plugin module. In an embodiment, the SVA-based message constructor is located within a kernel space along with the hardware accelerator.

At operation 909, a SVA-based message is constructed that includes the location and size of data segments within the decompressed data region.

At operation 911, the SVA-based message is transmitted to the hardware accelerator. In an embodiment, transmitting the SVA-based message to the hardware accelerator provides the hardware accelerator with a data layout of the decompressed data region. For example, the SVA-based message can indicate the offset and size of each data segment within the decompressed data region. In some embodiments, providing the hardware accelerator with the data layout of the decompressed data region reduces the number of context switches between the user space and the kernel space.

At operation 913 the hardware accelerator performs a number of verification sessions. Each verification session corresponds to a specific data segment indicated by the SVA-based message. In an embodiment, the hardware accelerator performs the verification sessions in a sequence that is different than a sequence corresponding to the location of the data segments within the decompressed data region. In some embodiments, providing the hardware accelerator with the data layout of the decompressed data region may reduce the number of hardware accelerator session launches necessary to perform verification.

Figure 10:
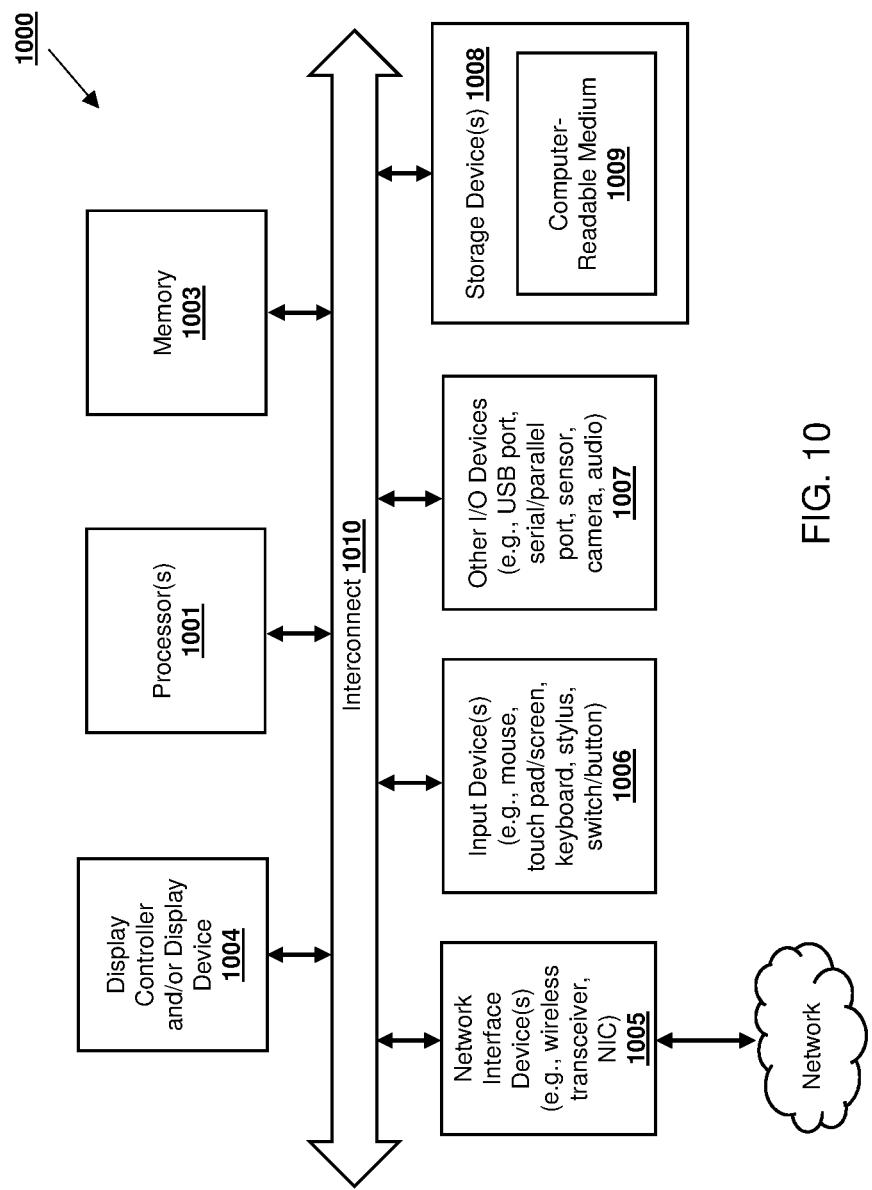
FIG. 10 is a block diagram illustrating an example of a data processing system that may be used with embodiments described herein.

FIG. 10 is a block diagram illustrating an example of a data processing system 1000 that may be used with embodiments described herein. The data processing system 1000 may represent any of the data processing systems described above and may perform any of the processes or methods described above. The data processing system 1000 can include many different components. These components can be implemented as integrated circuits (ICs), discrete electronic devices, or other modules adapted to a circuit board such as a motherboard or add-in card of the computer system, or as components otherwise incorporated within a chassis of the computer system. Note also that the data processing system 1000 is intended to show a high-level view of many components of the computer system. However, it is to be understood that additional components may be present in certain implementations and furthermore, different arrangement of the components shown may occur in other implementations. The data processing system 1000 may represent a desktop, a laptop, a tablet, a server, a mobile phone, a media player, a personal digital assistant (PDA), a personal communicator, a gaming device, a network router or hub, a wireless access point (AP) or repeater, a set-top box, or a combination thereof. Further, while only a single machine or system is illustrated, the term "machine" or "system" shall also be taken to include any collection of machines or systems that individually or jointly execute a set (or multiple sets) of instructions to perform any one or more of the methodologies discussed herein.

In one embodiment the data processing system 1000 includes one or more processor(s) 1001, memory 1003, network interface devices, 1005, I/O devices, 1006, 1007 and storage device(s) 1008 connected via a bus or an interconnect 1010. The one or more processor(s) 1001 may be a single processor or multiple processors with a single processor core or multiple processor cores included therein. The processor(s) 1001 may represent one or more general-purpose processors such as a microprocessor, a central processing unit (CPU), or the like. More particularly, the processor(s) 1001 may be a complex instruction set computing (CISC) microprocessor, reduced instruction set computing (RISC) microprocessor, very long instruction word (VLIW) microprocessor, or processor implementing other instruction sets, or processors implementing a combination of instruction sets. The processor(s) 1001 may also be one or more special-purpose processors such as an application specific integrated circuit (ASIC), a cellular or baseband processor, a field programmable gate array (FPGA), a digital signal processor (DSP), a network processor, a graphics processor, a network processor, a communications processor, a cryptographic processor, a co-processor, an embedded processor, or any other type of logic capable of processing instructions.

The processor(s) 1001 may be a low power multi-core processor, such as an ultra-low voltage processor, and may act as a main processing unit and central hub for communication with the various components of the system. Such processor can be implemented as a system on chip (SoC). The processor(s) 1001 are configured to execute instructions for performing the operations and steps discussed herein. The data processing system 1000 may further include a graphics/display subsystem 1004, which may include a display controller, a graphics processor, and/or a display device. In one embodiment at least a portion of the graphics/display subsystem 1004 is integrated into the processors(s) 1001. The graphics/display subsystem 1004 is optional and some embodiments may not include one or more components of the graphics/display subsystem 1004.

The processor(s) 1001 communicates with memory 1003, which in one embodiment can be implemented via multiple memory devices to provide for a given amount of system memory. The memory 1003 may include one or more volatile storage (or memory) devices such as random access memory (RAM), dynamic RAM (DRAM), synchronous DRAM (SDRAM), static RAM (SRAM), or other types of storage devices. The memory 1003 may store information including sequences of instructions that are executed by the one or more processor(s) 1001 or any other device. For example, executable code and/or data of a variety of operating systems, device drivers, firmware (e.g., input output basic system or BIOS), and/or applications can be loaded in the memory 1003 and executed by one of the processor(s) 1001. The operating system can be any kind of operating system such as, for example, Windows® operating system from Microsoft®, Mac OS®/iOS® from Apple, Android® from Google®, Linux®, Unix®, or other real-time or embedded operating systems such as VxWorks.

The data processing system 1000 may further include I/O devices such as a network interface device(s) 1005, input device(s) 1006, and other I/O device(s) 1007. Some of the input device(s) 1006 and other I/O device(s) 1007 may be optional and are excluded in some embodiments. The network interface device(s) 1005 may include a wireless transceiver and/or a network interface card (NIC). The wireless transceiver may be a WiFi transceiver, an infrared transceiver, a Bluetooth transceiver, a WiMax transceiver, a wireless cellular telephony transceiver, a satellite transceiver (e.g., a global positioning system (GPS) transceiver), or other radio frequency (RF) transceivers, or a combination thereof. The NIC may be an Ethernet card.

The input device(s) 1006 may include a mouse, a touch pad, a touch sensitive screen (which may be integrated with a display device of the graphics/display subsystem 1004), a pointer device such as a stylus, and/or a keyboard (e.g., physical keyboard or a virtual keyboard displayed as part of a touch sensitive screen). For example, the input device(s) 1006 may include a touch screen controller coupled to a touch screen. The touch screen and touch screen controller can, for example, detect contact and movement or a break thereof using any of a plurality of touch sensitivity technologies, including but not limited to capacitive, resistive, infrared, and surface acoustic wave technologies, as well as other proximity sensor arrays or other elements for determining one or more points of contact with the touch screen.

The other I/O device(s) 1007 may also include an audio device. An audio device may include a speaker and/or a microphone to facilitate voice-enabled functions, such as voice recognition, voice replication, digital recording, and/or telephony functions. The other I/O device(s) 1007 may also include universal serial bus (USB) port(s), parallel port(s), serial port(s), a printer, a network interface, a bus bridge (e.g., a PCI-PCI bridge), sensor(s) (e.g., a motion sensor such as an accelerometer, gyroscope, a magnetometer, a light sensor, compass, a proximity sensor, etc.), or a combination thereof. The other I/O device(s) 1007 may further include an imaging processing subsystem (e.g., a camera), which may include an optical sensor, such as a charged coupled device (CCD) or a complementary metal-oxide semiconductor (CMOS) optical sensor, utilized to facilitate camera functions, such as recording photographs and video clips. Certain sensors may be coupled to interconnect 1010 via a sensor hub (not shown), while other devices such as a keyboard or thermal sensor may be controlled by an embedded controller (not shown), dependent upon the specific configuration or design of data processing system 1000.

To provide for persistent storage of information such as data, applications, one or more operating systems and so forth, a mass storage (not shown) may also couple to the processor(s) 1001. In various embodiments, to enable a thinner and lighter system design as well as to improve system responsiveness, this mass storage may be implemented via a solid state device (SSD). However, in other embodiments the mass storage may primarily be implemented using a hard disk drive (HDD) with a smaller amount of flash based storage to act as an SSD cache to enable non-volatile storage of context state and other such information during power down events so that a fast power up can occur on re-initiation of system activities. In addition, a flash device may be coupled to the processor(s) 1001, e.g., via a serial peripheral interface (SPI). This flash device may provide for non-volatile storage of system software, including a basic input/output software (BIOS) as well as other firmware of the system.

The storage device(s) 1008 may include computer-readable storage medium 1009 (also known as a machine-readable storage medium) on which is stored one or more sets of instructions or software embodying any one or more of the methodologies or functions described herein. The computer-readable storage medium 1009 may also be used to store the same software functionalities described above persistently. While the computer-readable storage medium 1009 is shown in an exemplary embodiment to be a single medium, the term "computer-readable storage medium" should be taken to include a single medium or multiple media (e.g., a centralized or distributed database, and/or associated caches and servers) that store the one or more sets of instructions. The terms "computer-readable storage medium" shall also be taken to include any medium that is capable of storing or encoding a set of instructions for execution by the machine and that cause the machine to perform any one or more of the methodologies of the present invention. The term "computer-readable storage medium" shall accordingly be taken to include, but not be limited to, solid-state memories, and optical and magnetic media, or any other non-transitory machine-readable medium.

Note that while the data processing system 1000 is illustrated with various components of a data processing system, it is not intended to represent any particular architecture or manner of interconnecting the components; as such, details are not germane to embodiments of the present invention. It will also be appreciated that network computers, handheld computers, mobile phones, servers, and/or other data processing systems, which have fewer components or perhaps more components, may also be used with embodiments of the invention.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities.

It should be borne in mind, however, that all of these and similar terms are to be associated with the appropriate physical quantities and are merely convenient labels applied to these quantities. Unless specifically stated otherwise as apparent from the above discussion, it is appreciated that throughout the description, discussions utilizing terms such as those set forth in the claims below, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

Embodiments of the invention also relate to an apparatus for performing the operations herein. Such a computer program is stored in a non-transitory computer readable medium. A machine-readable medium includes any mechanism for storing information in a form readable by a machine (e.g., a computer). For example, a machine-readable (e.g., computer-readable) medium includes a machine (e.g., a computer) readable storage medium (e.g., read only memory ("ROM"), random access memory ("RAM"), magnetic disk storage media, optical storage media, flash memory devices).

The processes or methods depicted in the preceding figures may be performed by processing logic that comprises hardware (e.g. circuitry, dedicated logic, etc.), software (e.g., embodied on a non-transitory computer readable medium), or a combination of both. Although the processes or methods are described above in terms of some sequential operations, it should be appreciated that some of the operations described may be performed in a different order. Moreover, some operations may be performed in parallel rather than sequentially. Embodiments described herein are not described with reference to any particular programming language. It will be appreciated that a variety of programming languages may be used to implement the teachings of embodiments of the invention as described herein.

The following clauses and/or examples pertain to specific embodiments or examples thereof. Specifics in the examples may be used anywhere in one or more embodiments. The various features of the different embodiments or examples may be variously combined with some features included and others excluded to suit a variety of different applications. Examples may include subject matter such as a method, means for performing acts of the method, at least one machine-readable medium including instructions that, when performed by a machine cause the machine to performs acts of the method, or of an apparatus or system according to embodiments and examples described herein. Various components can be a means for performing the operations or functions described.

One embodiment provides for a computer implemented method of data decompression and verification. The method includes decompressing a compressed data segment to generate a decompressed data region; and generating a segment vector array (SVA) including a number of segment vectors corresponding to data segments within the decompressed data region, with each segment vector indicating a location and a size of a corresponding data segment. The method also includes transmitting the SVA to a chain plugin module; transmitting segment vector array data to a SVA-based message constructor; constructing a SVA-based message including the location and size of data segments within the decompressed data region; transmitting the SVA-based message to a hardware accelerator; and performing a plurality of verification sessions at the hardware accelerator. Each verification session corresponds to a specific data segment indicated by the SVA-based message. In an embodiment, the chain plugin module is located within a user space along with a filesystem responsible for generating the segment vector array. In an embodiment, the SVA-based message constructor is located within a kernel space along with the hardware accelerator. In an embodiment, the hardware accelerator performs the verification sessions in a verification sequence that is different than a sequence corresponding to the location of the data segments within the decompressed data region. In an embodiment, transmitting the SVA-based message to the hardware accelerator provides the hardware accelerator with a data layout of the decompressed data region. In an embodiment, providing the hardware accelerator with the data layout of the decompressed data region reduces a number of context switches between the user space and the kernel space. In an embodiment, providing the hardware accelerator with the data layout of the decompressed data region reduces a number of hardware accelerator session launches.

According to another aspect, the present disclosure relates to a data decompression and verification system. The system includes a hardware accelerator for decompressing data to generate a decompressed data region and performing data verification; and a filesystem configured to generate a segment vector array (SVA) including a plurality of segment vectors corresponding to data segments within the decompressed data region. Each segment vector indicates a location and a size of a corresponding data segment. The system also includes a chain plugin module configured to receive the SVA from the filesystem; and a SVA-based message constructor. The SVA-based message constructor is configured to receive segment vector array data from the chain plugin module; construct a SVA-based message including the location and size of data segments within the decompressed data region; and transmit the SVA-based message to the hardware accelerator. The hardware accelerator is also configured to perform verification sessions, each verification session corresponding to a specific data segment indicated by the SVA-based message. In an embodiment, the chain plugin module is located within a user space along with the filesystem responsible for generating the SVA. In an embodiment, the SVA-based message constructor is located within a kernel space along with the hardware accelerator. In an embodiment, the hardware accelerator performs the verification sessions in a verification sequence that is different than a sequence corresponding to the location of the data segments within the decompressed data region. In an embodiment, transmitting the SVA-based message to the hardware accelerator provides the hardware accelerator with a data layout of the decompressed data region. In an embodiment, providing the hardware accelerator with the data layout of the decompressed data region reduces a number of context switches between the user space and the kernel space. In an embodiment, providing the hardware accelerator with the data layout of the decompressed data region reduces a number of hardware accelerator session launches.

According to another aspect, the present disclosure relates to a non-transitory computer-readable medium storing instructions which, when executed by one or more processors, cause the one or more processors to perform a data decompression and verification operation. The operation includes decompressing a compressed data segment to generate a decompressed data region; and generating a segment vector array (SVA) including a number of segment vectors corresponding to data segments within the decompressed data region, each segment vector indicating a location and a size of a corresponding data segment. The operation also includes transmitting the SVA to a chain plugin module; transmitting segment vector array data to a SVA-based message constructor; constructing a SVA-based message including the location and size of data segments within the decompressed data region; transmitting the SVA-based message to a hardware accelerator; and performing a plurality of verification sessions at the hardware accelerator. Each verification session corresponds to a specific data segment indicated by the SVA-based message. In an embodiment, the chain plugin module is located within a user space along with a filesystem responsible for generating the segment vector array. In an embodiment, the SVA-based message constructor is located within a kernel space along with the hardware accelerator. In an embodiment, the hardware accelerator performs the verification sessions in a verification sequence that is different than a sequence corresponding to the location of the data segments within the decompressed data region. In an embodiment, transmitting the SVA-based message to the hardware accelerator provides the hardware accelerator with a data layout of the decompressed data region. In an embodiment, providing the hardware accelerator with the data layout of the decompressed data region reduces a number of context switches between the user space and the kernel space.

In the foregoing specification, the invention has been described with reference to specific embodiments thereof. However, various modifications and changes can be made thereto without departing from the broader spirit and scope of the invention. The specification and drawings are, accordingly, to be regarded in an illustrative rather than a restrictive sense.

What is claimed is:

1. A computer implemented method of data decompression and verification, comprising:
   decompressing a compressed data segment to generate a decompressed data region;
   generating a segment vector array (SVA) including a plurality of segment vectors corresponding to data segments within the decompressed data region, each segment vector indicating a location and a size of a corresponding data segment;
   transmitting the SVA to a chain plugin module;
   transmitting segment vector array data to a SVA-based message constructor;
   constructing a SVA-based message including the location and size of data segments within the decompressed data region;
   transmitting the SVA-based message to a hardware accelerator; and
   performing a plurality of verification sessions at the hardware accelerator, each verification session corresponding to a specific data segment indicated by the SVA-based message.

2. The computer implemented method as in claim 1, wherein the chain plugin module is located within a user space along with a filesystem responsible for generating the segment vector array.

3. The computer implemented method as in claim 2, wherein the SVA-based message constructor is located within a kernel space along with the hardware accelerator.

4. The computer implemented method as in claim 1, wherein the hardware accelerator performs the plurality of verification sessions in a verification sequence that is different than a sequence corresponding to the location of the data segments within the decompressed data region.

5. The computer implemented method as in claim 1, wherein transmitting the SVA-based message to the hardware accelerator provides the hardware accelerator with a data layout of the decompressed data region.

6. The computer implemented method as in claim 5, wherein providing the hardware accelerator with the data layout of the decompressed data region reduces a number of context switches between a user space and a kernel space.

7. The computer implemented method as in claim 5, wherein providing the hardware accelerator with the data layout of the decompressed data region reduces a number of hardware accelerator session launches.

8. A data decompression and verification system comprising:
   a hardware accelerator for decompressing data to generate a decompressed data region and performing data verification;
   a filesystem configured to generate a segment vector array (SVA) including a plurality of segment vectors corresponding to data segments within the decompressed data region, each segment vector indicating a location and a size of a corresponding data segment;
   a chain plugin module configured to receive the SVA from the filesystem; and
   a SVA-based message constructor configured to:
   receive segment vector array data from the chain plugin module;
   construct a SVA-based message including the location and size of data segments within the decompressed data region; and
   transmit the SVA-based message to the hardware accelerator,
   wherein the hardware accelerator is further configured to perform a plurality of verification sessions, each verification session corresponding to a specific data segment indicated by the SVA-based message.

9. The data decompression and verification system as in claim 8, wherein the chain plugin module is located within a user space along with the filesystem responsible for generating the SVA.

10. The data decompression and verification system as in claim 9, wherein the SVA-based message constructor is located within a kernel space along with the hardware accelerator.

11. The data decompression and verification system as in claim 8, wherein the hardware accelerator performs the plurality of verification sessions in a verification sequence that is different than a sequence corresponding to the location of the data segments within the decompressed data region.

12. The data decompression and verification system as in claim 8, wherein transmitting the SVA-based message to the hardware accelerator provides the hardware accelerator with a data layout of the decompressed data region.

13. The data decompression and verification system as in claim 12, wherein providing the hardware accelerator with the data layout of the decompressed data region reduces a number of context switches between a user space and a kernel space.

14. The data decompression and verification system as in claim 12, wherein providing the hardware accelerator with the data layout of the decompressed data region reduces a number of hardware accelerator session launches.

15. A non-transitory computer-readable medium storing instructions which, when executed by one or more processors, cause the one or more processors to perform a data decompression and verification operation, the operation comprising:
   decompressing a compressed data segment to generate a decompressed data region;
   generating a segment vector array (SVA) including a plurality of segment vectors corresponding to data segments within the decompressed data region, each segment vector indicating a location and a size of a corresponding data segment;
   transmitting the SVA to a chain plugin module;
   transmitting segment vector array data to a SVA-based message constructor;
   constructing a SVA-based message including the location and size of data segments within the decompressed data region;
   transmitting the SVA-based message to a hardware accelerator; and
   performing a plurality of verification sessions at the hardware accelerator, each verification session corresponding to a specific data segment indicated by the SVA-based message.

16. The non-transitory computer-readable medium as in claim 15, wherein the chain plugin module is located within a user space along with a filesystem responsible for generating the segment vector array.

17. The non-transitory computer-readable medium as in claim 16, wherein the SVA-based message constructor is located within a kernel space along with the hardware accelerator.

18. The non-transitory computer-readable medium as in claim 15, wherein the hardware accelerator performs the plurality of verification sessions in a verification sequence that is different than a sequence corresponding to the location of the data segments within the decompressed data region.

19. The non-transitory computer-readable medium as in claim 15, wherein transmitting the SVA-based message to the hardware accelerator provides the hardware accelerator with a data layout of the decompressed data region.

20. The non-transitory computer-readable medium as in claim 19, wherein providing the hardware accelerator with the data layout of the decompressed data region reduces a number of context switches between a user space and a kernel space.

* * * * *